(12) United States Patent
Maul et al.

(10) Patent No.: US 7,126,692 B2
(45) Date of Patent: Oct. 24, 2006

(54) DEVICE FOR HOLDING MEASUREMENT INSTRUMENTS

(75) Inventors: Guenter Maul, Aalen (DE); Norbert Hubig, Gerstetten (DE)

(73) Assignee: Carl Zeiss SMT AG, Oberkochen (DE)

( * ) Notice: Subject to any disclaimer, the term of this patent is extended or adjusted under 35 U.S.C. 154(b) by 294 days.

(21) Appl. No.: 10/735,977

(22) Filed: Dec. 15, 2003

(65) Prior Publication Data

US 2004/0146336 A1    Jul. 29, 2004

(30) Foreign Application Priority Data

Dec. 18, 2002 (DE) ................................ 102 59 186

(51) Int. Cl.
*G01B 9/02* (2006.01)
*F16C 9/00* (2006.01)

(52) U.S. Cl. ........................................ 356/450; 403/30

(58) Field of Classification Search ............... 356/451, 356/498, 500, 450, 244, 598; 403/30; 359/820
See application file for complete search history.

(56) References Cited

U.S. PATENT DOCUMENTS

| | | | |
|---|---|---|---|
| 6,099,193 A | 8/2000 | Hangleiter et al. | 403/268 |
| 6,111,691 A | 8/2000 | Trunz et al. | 359/398 |
| 6,227,754 B1 | 5/2001 | von Nessen-Lapp et al. | 403/268 |
| 6,876,452 B1 * | 4/2005 | Evans et al. | 356/498 |
| 2003/0010902 A1 | 7/2002 | Hof et al. | |

* cited by examiner

*Primary Examiner*—Gregory J. Toatley, Jr.
*Assistant Examiner*—Marissa J Detschel
(74) *Attorney, Agent, or Firm*—Welsh & Katz, Ltd.

(57) ABSTRACT

A device for holding measurement instruments (2), in particular interferometers, is formed from a plurality of structure elements (4, 5, 6, 7) connected to one another and made from at least one material. The at least one material has a very low coefficient of thermal expansion $\alpha$. The structure elements (4) on which the measurement instruments (2) are arranged are secured between at least two structure side parts (5) in such a way that the thermal expansions of the structure side parts (5) and of the connections (3) have no effect in the measurement direction of the measurement instruments (2).

20 Claims, 4 Drawing Sheets

DEVICE FOR HOLDING MEASUREMENT INSTRUMENTS

BACKGROUND OF THE INVENTION

1. Field of the Invention

The invention relates to a device for holding measurement instruments, in particular interferometers, formed from a plurality of structure elements connected to one another and made from at least one material, the at least one material having a very low coefficient of thermal expansion α, in particular being a glass-ceramic or a metal alloy.

Moreover, the present invention also relates to a device for the stress-free connection of at least two components.

2. Description of the Related Art

In the case of optical systems which are intended to be suitable for generating optical images with a very high level of accuracy, for example optical systems for lithography, the individual optical elements have to be positioned as accurately as possible in all six degrees of freedom in terms of their orientation.

Optical systems of this type often include sensors which are able to monitor the position of the optical elements and carry out path length measurements or measurements relating to the change in path length.

If optical systems of this type are used in practice, loads on the optical system itself may arise on account of temperature fluctuations which may occur through environmental influences. These temperature fluctuations may have a serious effect on the results, in particular in the case of objectives used in semiconductor lithography; to achieve a very high level of measurement accuracy, the influence of thermal expansion should be minimized.

DE 101 34 387.6, which was not published before the priority date of the present application, describes an objective, in particular a semiconductor lithography, which has two separate structures. A load structure is intended to hold optical elements, in particular mirrors, while a further structure is designed as a measurement or reference frame. The load structure in this case bears the entire load of the optical element and the reaction forces which occur in the event of corresponding movements. The measurement structure, on the other hand, bears only its own weight, so that a highly stable measurement structure can be achieved.

A measurement frame of this type can be produced from materials which are known in the prior art with a very low thermal expansion, such as for example ZERODUR®, ULE or the like. However, large measurement frames have to be assembled and connected from a plurality of structure parts made from materials of this type. Although the materials used have a low thermal expansion, they are not suitable for producing connecting elements required for assembly, on account of their mechanical properties. In the region of the connections between the individual structure elements, the materials used there for the connecting elements means that the thermal expansions will be very much greater. The geometric dimensions of the overall measurement frame will therefore change when temperature fluctuations occur to a sufficient extent for the required degree of accuracy in the nanometer range no longer to be achieved.

Furthermore, in connection with the prior art reference is also made to U.S. Pat. No. 6,227,754 B1, U.S. Pat. No. 6,111,691 A and U.S. Pat. No. 6,099,193 A.

SUMMARY OF THE INVENTION

The present invention is therefore based on the object of realizing a measurement frame of this type, which bears the measurement instruments, with a view to avoiding the abovementioned drawbacks.

According to the invention, this object is achieved by virtue of the fact that the structure elements on which the measurement instruments are arranged are secured between at least two structure side parts in such a way that the thermal expansions of the structure side parts and of the connections have no effect in the measurement direction of the measurement instruments.

The structure elements are made from the material with a very low coefficient of thermal expansion α, which is known per se and is standard in this field, such as for example glass-ceramic, in this case in particular ZERODUR®. The individual structure elements are arranged and connected in such a way that the thermal expansion of the connection between the structure elements take effect only in one direction, which is not in the direction responsible for positioning of the measurement instruments or perpendicular to the structure elements which bear the measurement instruments.

This solution according to the invention means that the device is now only able to expand in certain directions, which are not relevant to the measurement tasks in the nanometer range, in the event of temperature fluctuations.

This allows a very rigid system to be obtained, which retains its shape and position irrespective of temperature.

In a particularly advantageous way, it may be the case that all the connections can be produced by means of connecting elements, while temperature fluctuations can only influence structure elements which do not bear any measurement instruments and are not responsible for determining positions in another component.

On account of the fact that there are no direct connections between the structure elements, but rather the connections are made by means of connecting elements, expansions which inevitably occur in the event of temperature changes take place only in directions which have no influence on the measurement position. In this way, a very high level of measurement accuracy can be achieved.

A particularly advantageous embodiment of the invention is characterized by a connecting device having a coefficient of thermal expansion α which deviates from a coefficient of thermal expansion α of two structure elements which are to be connected without stresses, each of the structure elements being gripped by means of a connecting element which is formed symmetrically with respect to the structure element, and the connecting elements being connected to one another via securing means.

In this case, connecting elements and securing means are used for stress-free connection of two structure parts, and the coefficients of thermal expansion α of the structure elements and of the connecting elements or the securing means are not equal. Each structure element is gripped by means of a connecting element which is formed symmetrically with respect to the structure element. The connecting elements are advantageously connected to the corresponding structure elements by means of an adhesive. The advantage of securing the structure elements via the connecting elements in this way is that in the event of temperature fluctuations the position of the structure elements is retained. Multiple adhesive bonding of the structure elements to the connecting elements ensures that it is impossible for them to peel off.

Further advantageous configurations of the invention will emerge from the further subclaims and from the exemplary embodiment presented below with reference to the drawings.

DETAILED DESCRIPTION

Figure 1:
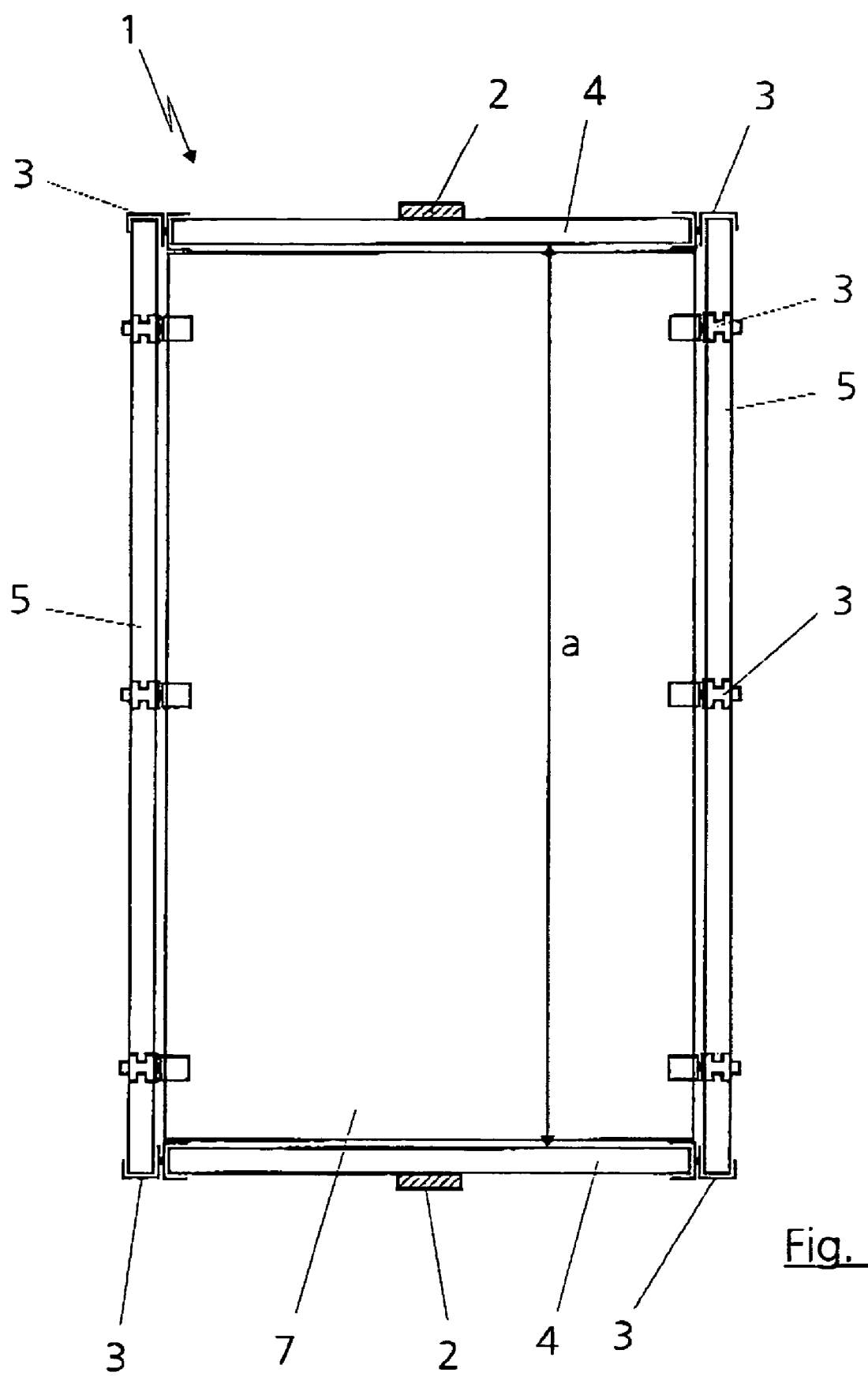
FIG. 1 shows an outline illustration of a device according to the invention for holding measurement instruments, in plan view.

FIG. 1 shows an outline illustration in plan view of a device 1 according to the invention, which is used to hold measurement instruments 2, in this case in particular interferometers, in the installed position. In the highly simplified exemplary embodiment shown here, the device 1, which is also referred to below as the measurement structure, is designed as a temperature-stable construction for holding the measurement means (interferometers 2). To achieve thermal stability, the arrangement of connecting elements 3 for structure elements 4, 5, 6 and 7 is to be selected in such a way that expansions of the connecting elements 3 and also of the structure elements 4, 5, 6 and 7 can be permitted but the expansions do not act in the measurement direction of the interferometers 2. To ensure that the expansions are only minimal, the coefficient of thermal expansion $\alpha$ of the structure elements 4, 5, 6 and 7 is to be kept as low as possible, which means that materials such as glass-ceramics or metal alloys should be used for the structure elements 4, 5, 6 and 7. Since according to the prior art glass-ceramics cannot be screwed, clamped or used for connections of this nature, the connecting elements 3 have to perform this role. The connecting elements 3 should likewise be made from a material with a very low coefficient of thermal expansion $\alpha$, in order to avoid high levels of thermal expansion. The material used here for the connecting elements 3 is INVAR; it is also possible to use other materials with a correspondingly low coefficient of thermal expansion $\alpha$. The interferometers 2 are arranged on the structure elements 4. The structure elements 4 are secured to the structure side parts 5 via the connecting elements 3 in such a way that the thermal expansions of the structure side parts 5 and of the connecting elements 3 do not act in the measurement direction of the interferometers 2.

Overall, the structure elements 4 together with the structure side parts 5 form a cuboid, the structure side parts 5 being secured by means of a structure back part 6 which is arranged between them and is not shown in this exemplary embodiment. The structure back part 6 is not directly connected to the structure elements 4 on which the interferometers 2 are arranged.

The structure side parts 5 and the structure elements 4 are connected to a structure front plate 7, likewise via the connecting elements 3. Depending on temperature fluctuations, the structure side plates 5 may move inward or outward over the connecting elements 3, but the structure elements 4 should remain in a stable position with respect to the structure front plate 7. This is a precondition for it to be possible to achieve ultra-accurate measurement using the interferometers 2.

FIG. 1 clearly shows that structure side parts 5 may move over the connecting elements 3 in the event of temperature fluctuations but a distance a only moves by an amount corresponding to the coefficient of thermal expansion $\alpha$ of the structure material, in this case in particular ZERODUR®.

Figure 2:
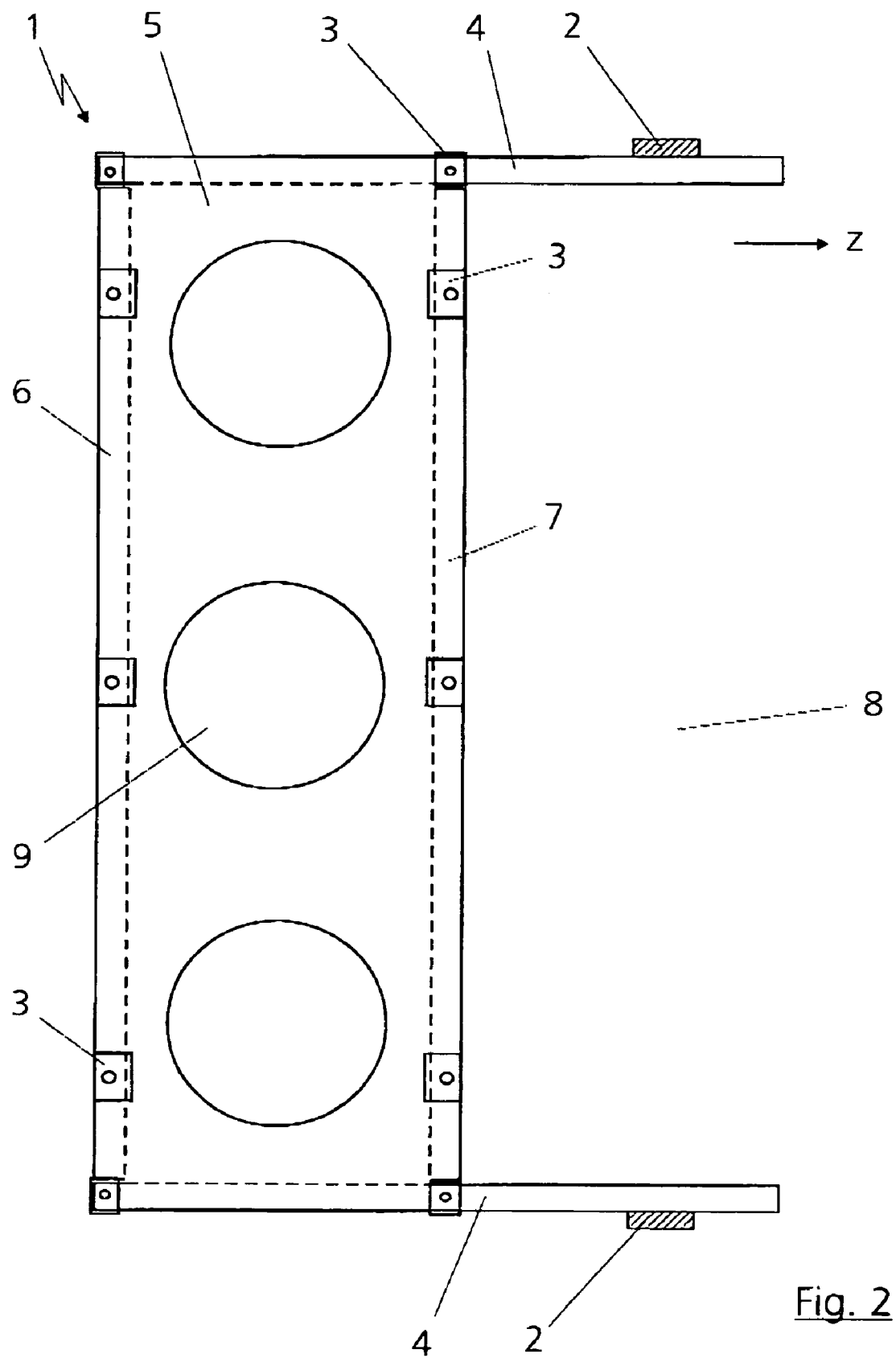
FIG. 2 shows an outline side view of the structure shown in FIG. 1.

FIG. 2 shows a side view of the measurement structure 1 illustrated in FIG. 1. The structure elements 4 are designed to be wider in the Z direction, in order to be able to hold the interferometers 2 directly so that in this way a measurement can be carried out inside a free space 8, it being possible for a measurement object, in particular an optical element, to be introduced into this free space 8. Cutouts 9 are formed into the structure side parts 5. Of course, the cutouts 9 may also be introduced into all the other structure elements 4, 6 and 7. The cutouts 9 are generally used to reduce weight, since the measurement structure 1 would have a relatively high weight in the event of a relatively large design. The cutouts 9 also serve to make the temperature of an appliance into which the measurement structure 1 can be introduced more uniform. Therefore, the cutouts 9 ensure ventilation, since otherwise heat could build up inside the measurement structure 1, and as a result the entire frame structure would be distorted. This also allows targeted through-flow.

As can be seen clearly from FIGS. 1 and 2, the structure elements 4, 5, 6 and 7 are only connected to one another via the connecting elements 3, which means that there is no direct attachment between the structure elements 4 (platform for the measurement means) and the structure front part 7 (platform for securing in a device), and therefore the expansion behavior of the connecting elements 3 between these two or further structure elements 4 is of no importance.

Figure 3:
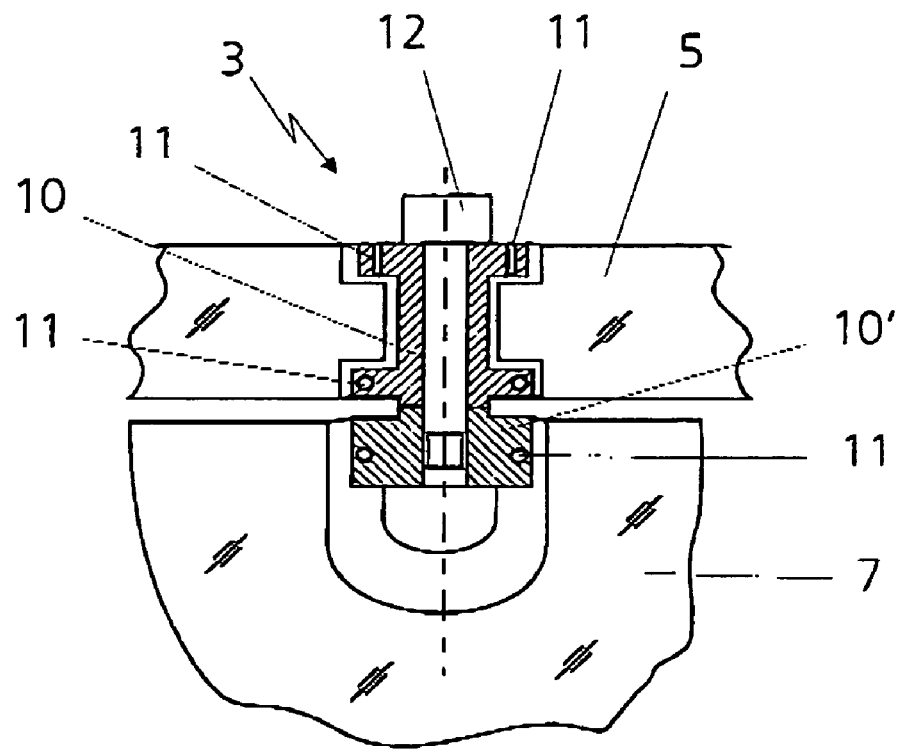
FIG. 3 shows an outline illustration of a device for stress-free connection of components.
Figure 4:
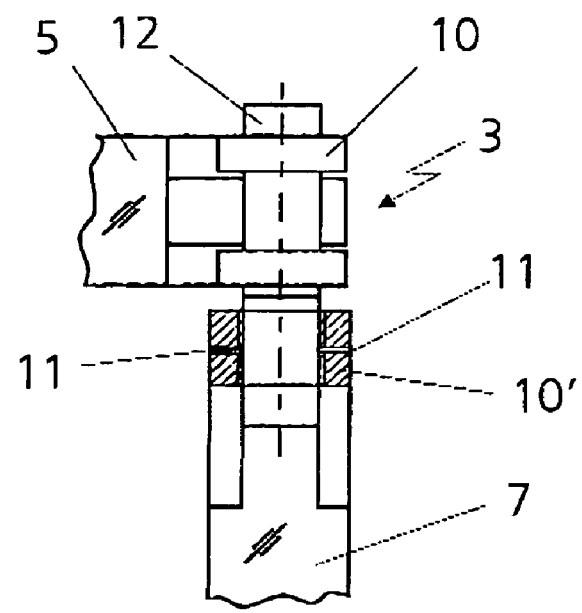
FIG. 4 shows an outline side view of the structure shown in FIG. 3.

FIG. 3, and also FIG. 4, illustrate the connecting device 3 in more detail. In this exemplary embodiment, the connecting device 3 is in each case connected to the structure side part 5 and to the structure front part 7. Connecting elements 10 and 10' are H-shaped in cross section. The connecting elements 10 and 10' are introduced into an opening or cutout in the structure elements 5 and 7 in such a way that the material of the structure elements 5 and 7 is in each case arranged between limbs of the H-shaped connecting elements 10 and 10'. This ensures a connecting device 3 which is formed symmetrically with respect to the structure elements 5 and 7.

Bores 11, into which adhesive for securing the connecting elements 10 and 10' to the structure elements 5 and 7 is introduced, are provided at the connecting elements 10 and 10'. The adhesive is an adhesive which is suitably matched to the materials.

The structure elements 5 and 7 are moved into position using auxiliary elements, such as angle brackets or supports, and then the screwed and prestressed connecting device 3 is introduced and secured at the intended locations 11 using adhesive. In the process, the connecting device 3 can be held in position by further auxiliary elements (soft attachment). Therefore, after the adhesive has set, a connection which is as far as possible stress-free has formed. The individual structure elements 5 and 7 can be dismantled after adhesive bonding, the corresponding connecting element 10 or 10' remaining in place at each structure element 5 and 7, since the parts 5, 7, 10 and 10' are fixedly connected to one another by the adhesive.

The individual connecting elements 10 and 10' are connected to one another by a securing means, in this case in particular a bolt 12. The connecting element 10' in this case serves as a centering means and nut for the bolt 12, since an internal screw thread is provided in the connecting element 10'. During dismantling of the structure elements 5 and 7, it is possible for the structure elements 5 and 7 with the connecting elements 10 and 10' to be separated from one another as a result of the bolt 12 being loosened and removed. This structure facilitates installation in an appliance or machine.

The main advantage of the connecting elements 10 and 10' is that they are always positioned symmetrically with respect to the structure plane, and the arrangement does not allow any peeling off. This is ensured by virtue of the fact that in each case one adhesive-bonding location is provided at the limbs of the connecting elements 10 and 10' and the adhesive bonds are in this case supported on one another.

FIG. 4 shows a side view of the connecting device 3 illustrated in FIG. 3, once again emphasizing the H-shaped cross section of the connecting elements 10 and 10'.

Figure 5:
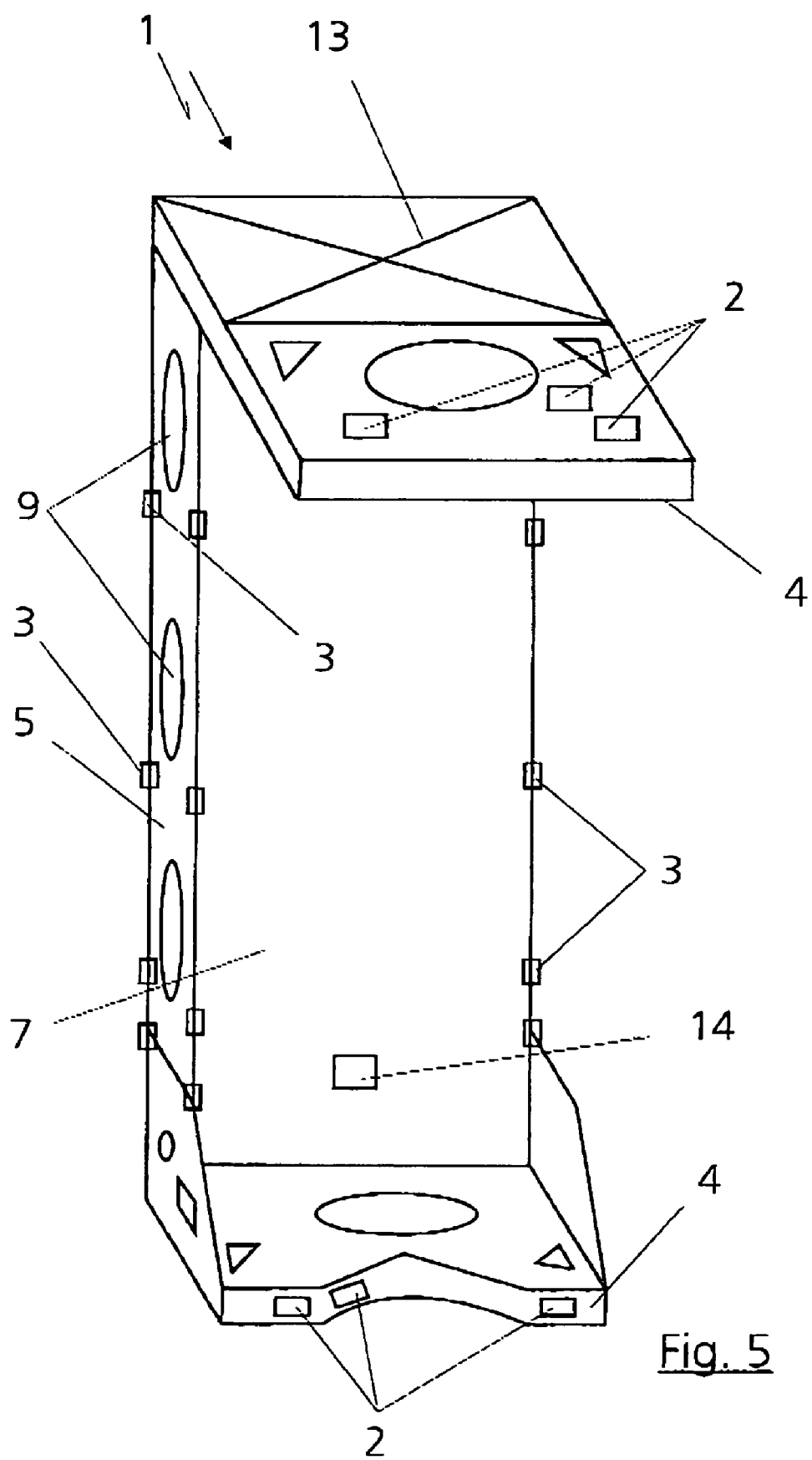
FIG. 5 shows a perspective illustration of the device according to the invention with measurement instruments.

FIG. 5 shows a perspective view of the measurement structure 1; in this case the cuboidal structure, as has already been mentioned under FIG. 2, can be seen once again. On the upper part of the cuboid there is a connecting part 13, which is designed in an X shape. The connecting part 13 is in each case secured only to the structure side parts 5. Further connecting parts 13 may be located in the interior of the cuboid and at the lower part of the measurement structure. They are used to reinforce the overall measurement structure 1.

Fixing points 14 are also present on the measurement structure 1. The fixing points 14 are fixedly connected to the structure front plates 7 to allow it to be mounted in an appliance or machine.

A plurality of interferometers 2 are illustrated in this exemplary embodiment (FIG. 5). Since the measurement structure 1 can particularly advantageously be used for measurements in an imaging device for microlithography, it can therefore be used in particular to check the installation position of objectives. In this case, a reticle is arranged above the objective, the reticle structure being imaged into an object plane, in particular onto a sensor. To allow accurate control of the reticle, the position of the reticle has to be accurately determined. This can be carried out using interferometers 2 of this type, which in this case are advantageously formed as laser interferometers. Measurement paths for determining the position of the optical elements can be built up via laser interferometers 2; in the present exemplary embodiment in each case three laser interferometers 2 are arranged on a structure element 4. In an electronic data processing unit, the values determined can be recalculated or converted into absolute position values for the respective optical element.

Since this requires the highest possible accuracy of the measurement values, the measurements are carried out in the nanometer range. The measurement structure 1 can likewise be used for measurements in mechanical precision measurement technology, which on account of current requirements is carried out primarily in the nanometer range. Other applications would also be conceivable.

Constructing the measurement structure 1 from materials with a very low coefficient of thermal expansion $\alpha$ allows the imaging quality of optical elements to be determined with significantly greater accuracy as a result of the accurate and precise measurement by the interferometers 2.

What is claimed is:

1. A device for holding measurement instruments formed from a plurality of structure elements connected to one another and made from at least one material, the at least one material having a very low coefficient of thermal expansion $\alpha$, wherein the structure elements on which the measurement instruments are arranged are secured between at least two structure side parts in such a way that the thermal expansions of the structure side parts and of the connections have no effect in the measurement direction of the measurement instruments.

2. The device as claimed in claim 1, wherein the structure elements at least approximately form a cuboid, the structure elements on which the measurement instruments are arranged being secured between the at least two structure side parts, the structure side parts being connected by means of a structure front part and structure back part secured between them, and the structure back part and the structure front part not being connected to the structure elements on which the measurement instruments are arranged.

3. The device as claimed in claim 1, wherein all the connections can be produced by means of connecting elements, while temperature fluctuations can only influence structure elements which do not bear any measurement instruments and are not responsible for determining positions in another component.

4. The device as claimed in claim 3, wherein the connecting elements are made from a material with a very low coefficient of thermal expansion $\alpha$.

5. The device as claimed in claim 1, wherein the plurality of structure elements having at least one material with a very low coefficient of thermal expansion $\alpha$ are made of a glass-ceramic or a metal alloy.

6. The device as claimed in claim 1, wherein the structure elements and/or the structure side parts are provided with cutouts.

7. The device as claimed in claim 2, wherein at least two connecting parts, which are connected to the structure side parts, are provided inside the cuboid.

8. A connecting device having a coefficient of thermal expansion $\alpha$ which deviates from a coefficient of thermal expansion $\alpha$ of two structure elements which are to be connected without stresses, each of the structure elements being gripped by means of at least a pair of connecting elements which are formed symmetrically with respect to the structure element and the pair of connecting elements being connected to one another via securing means.

9. The device as claimed in claim 8, wherein the connecting elements are H-shaped in cross section and are introduced into an opening and/or cutout in the structure element in such a way that the material of the structure element is in each case arranged between limbs of the H-shaped connecting elements.

10. The device as claimed in claim 9, wherein an adhesive is introduced between the limbs of the connecting elements and the structure element.

11. The device as claimed in claim 8, wherein the securing means are designed as bolts.

12. The device as claimed in claim 1, wherein measurement paths for use by said measurement instruments can be built up via laser interferometers, with an optical element being assigned at least one laser interferometer for determining position, which interferometer is fixedly connected to a structure element.

13. The device as claimed in claim 12, wherein absolute position values for the respective optical element can be calculated from all the values determined by the at least one laser interferometer for determining the position of the optical element.

14. A device for holding interferometers, formed from a plurality of structure elements connected to one another and made from at least one material, the at least one material having a very low coefficient of thermal expansion $\alpha$, wherein the structure elements on which the interferometers are arranged are secured between at least two structure side parts in such a way that the thermal expansions of the structure side parts and of the connections have no effect in the measurement direction of the interferometers.

15. The device as claimed in claim 14, wherein the structure elements at least approximately form a cuboid, the structure elements on which the interferometers are arranged being secured between the at least two structure side parts, the structure side parts being connected by means of a structure front part and structure back part secured between them, and the structure back part and the structure front part not being connected to the structure elements on which the interferometers are arranged.

16. The device as claimed in claim 14, wherein all the connections can be produced by means of connecting elements, while temperature fluctuations can only influence structure elements which do not bear any interferometers and are not responsible for determining positions in another component.

17. The device as claimed in claim 14, wherein the structure elements and/or the structure side parts are provided with cutouts.

18. The device as claimed in claim 15, wherein at least two connecting parts, which are connected to the structure side parts, are provided inside the cuboid.

19. The use of the device as claimed in one of claims 1 to 18 for measurements in an imaging device for microlithography.

20. The use of the device as claimed in one of claims 1 to 18 for measurements in mechanical precision measurement technology in the nanometer range.

* * * * *

UNITED STATES PATENT AND TRADEMARK OFFICE
CERTIFICATE OF CORRECTION

PATENT NO.        : 7,126,692 B2                                      Page 1 of 1
APPLICATION NO. : 10/735977
DATED             : October 24, 2006
INVENTOR(S)       : Maul et al.

It is certified that error appears in the above-identified patent and that said Letters Patent is hereby corrected as shown below:

Column 1, line 29
Please delete "...this type arc..." and insert --...this type are...-- therefor Column 5, line 54
Please delete "...measurements arc..." and insert --...measurements are...-- therefor Signed and Sealed this Twenty-sixth Day of June, 2007

JON W. DUDAS
*Director of the United States Patent and Trademark Office*